United States Patent [19]

Bergmann

[11] Patent Number: 5,413,684
[45] Date of Patent: May 9, 1995

[54] METHOD AND APPARATUS FOR REGULATING A DEGREE OF REACTION IN A COATING PROCESS

[75] Inventor: Erich Bergmann, Mels, Switzerland

[73] Assignee: Balzers Aktiengesellschaft, Liechtenstein

[21] Appl. No.: 111,645

[22] Filed: Aug. 25, 1993

[30] Foreign Application Priority Data

Aug. 28, 1992 [CH] Switzerland .................. 2689/92

[51] Int. Cl.$^6$ .................................................. C23C 14/54
[52] U.S. Cl. .............................. 204/192.13; 204/192.12;
204/298.03; 204/298.07; 204/298.11;
204/298.15; 204/298.26; 204/298.08;
204/192.38; 204/298.41
[58] Field of Search ................... 204/192.12, 192.13,
204/192.15, 192.38, 298.03, 298.05, 298.07,
298.11, 298.15, 298.16, 298.26, 298.41; 118/723
VE, 723 EB; 427/523, 566

[56] References Cited

U.S. PATENT DOCUMENTS

| | | | |
|---|---|---|---|
| 4,526,802 | 7/1985 | Sato | 204/192.13 |
| 4,992,153 | 2/1991 | Bergmann et al. | 204/298.26 |
| 5,292,417 | 3/1994 | Kugler | 204/298.03 |

FOREIGN PATENT DOCUMENTS 60-17070 1/1985 Japan .................. 204/298.26

*Primary Examiner*—Robert Kunemund
*Assistant Examiner*—Rodney G. McDonald
*Attorney, Agent, or Firm*—Notaro & Michalos

[57] ABSTRACT

A method and apparatus for controlling a ratio $\gamma = x/y$, for the coating of a work piece with a layer $F_xG_y$, using plasma-enhanced reactive deposition processes, includes changing the rate at which a solid material is vaporized and also controlling the atmosphere within the vacuum chamber of the apparatus.

15 Claims, 2 Drawing Sheets

METHOD AND APPARATUS FOR REGULATING A DEGREE OF REACTION IN A COATING PROCESS

FIELD AND BACKGROUND OF THE INVENTION

The present invention relates in general to coating methods and apparatuses, and in particular to a new and useful method and apparatus for regulating the ratio between a solid and gaseous component of material to be coated onto a workpiece.

In the production of layers or coatings with a plasma-enhanced reactive deposition process, wherein reactive cathode sputtering at least participates, it is known to regulate the degree of reaction $\gamma$, to be a constant value or, in the sense of a master control, to obtain a profile of the degree of reaction along the layer thickness.

In control processes of this type, the regulating parameter is consequently the particular stoichiometric relation on the growing layer according to the stated ratio $\gamma$.

It is therein known to determine the so-called "measured regulating parameter" which deviates from the actual regulating parameter and from which, based on the known regularities, conclusions are drawn about the first, for example by means of plasma emission monitors, by means of quartz microbalances, mass spectrometers, etc.

As the so-called manipulated parameter, it is customary to set the sputtering rate of the cathode evaporation or the reactive gas flow into the vacuum chambers. Depending on the intended coating process, the cathode sputtering process can therein be operated with DC, DC and superimposed AC or with pure AC, such as for example Hf cathode sputtering.

It has been found that the above stated approach is often problematic in terms of regulation technology, inter alia due to instabilities of the regulation. This can be traced back, inter alia, to the fact that in the addressed reactive cathode sputtering the technical regulation path also forms with the sputtered cathode, the reaction process a time-variant regulation system. It does this because the reaction process influences also the surface of the sputtering cathode and therewith the behavior of the latter as a regulation path element. In this connection the phenomena of target contamination with insulating layers or islands is well known and the topic of an extensive literature.

SUMMARY OF THE INVENTION

The present invention provides a regulation method of the initially stated type, which can be stabilized significantly easier during the entire process time.

For this purpose the method according to the invention is used.

As has already been stated, the cathode sputtering process can be operated with DC, DC+AC or only AC and the material evaporated by the cathode sputtering can be a conducting or a non-conducting material or a semiconductor material. It is for example possible that the coating compound is formed only through the reactive process or that, when using a vaporization cathode (target) comprising the intended coating compound, a coating of the same compound with a modified stoichiometry can be generated by fine regulation in the reaction volume. In principle, all coating processes are addressed in which reactive cathode sputtering is involved.

Following another feature of the invention, the vaporized solid material itself can be involved in the layer growth or it is also possible that it is not involved in the layer growth wherein in the last stated case, the vaporized solid material is used only as a "reactive gas consumer", for adjusting the reactive gas partial pressure and consequently of the layer formed through the reactive sputtering and with the same reactive gas.

Following a further feature of the invention, the sputtering rate and the reactive gas influx are controlled, preferably each so as to be at least nearly constant if the layer is to be built up with a reaction degree which is to be constant or according to a given time-variable ratio of sputtering rate and reactive gas influx if the layer is to be built up in a manner which is controlled with a variable reaction degree profile. In the last stated case the command variable of the regulation for $\gamma$ is carried along.

The suggested operation according to the invention offers the additional significant advantage that for the determination of the measured regulating parameter, no longer are extremely expensive devices such as plasma emission monitors, microbalances etc., needed, but rather that the total pressure in the vacuum receptacle can be used as the measured regulating parameter. If the total pressure in the vacuum receptacle at a given sputtering rate and given reactive gas mass influx decreases, this means that the ratio $\gamma$ becomes too great, i.e. the layer in the process of growing becomes stoichiometrically unsaturated relative to the instantaneously desired degree of reaction. This is remedied by lowering the vaporization rate in the sense of and by means of regulation.

According to another feature of the invention, the vaporization is preferably realized through electron beam vaporization or arc discharge vaporization, for example through cathode spot vaporization, low-voltage arc vaporization or hollow cathode vaporization. Magnetron sputtering is preferably used as the cathode sputtering process.

To solve the initially posed task the coating apparatus of the invention is used.

The operation according to the invention or the coating apparatus or installation according to the invention have been successfully used for ion plating of workpieces.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

In the following the invention will be explained by example in conjunction with the drawings wherein.

DESCRIPTION OF THE PREFERRED EMBODIMENTS

Figure 1:
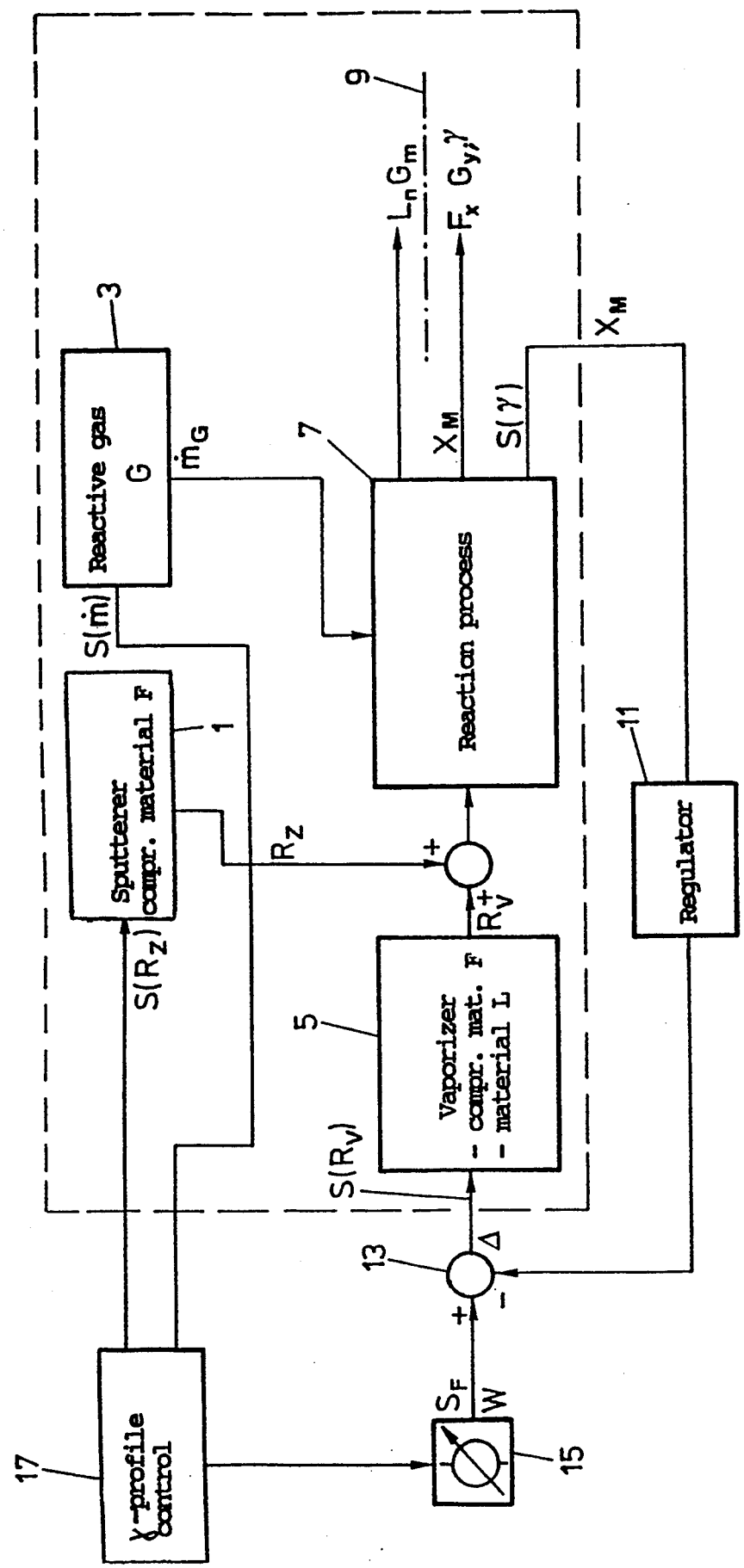
FIG. 1 is a signal flow/function block diagram of a control process according to the invention or of an apparatus or installation according to the invention.

FIG. 1 depicts a signal flow/function block diagram of the regulation process according to the invention or an apparatus according to the invention.

A vacuum receptacle or chamber, disposed in the representation according to FIG. 1 within a dashed line box, is provided with a cathode sputtering station 1 which, depending on the intended sputtering process is operated with DC, AC or AC+DC, and which is preferably a magnetron source.

The sputtering rate is selected as shown, with the control signal $S(R_z)$, at the sputtering source 1. A solid substance, which is at least part of the compound $F_xG_y$ to be deposited as a layer, is vaporized by means of the sputtering source 1. From the sputtering source 1 the sputtered material is fed to the reaction process 7 in the vacuum chamber, at the sputtering rate $R_z$. From a reactive gas tank the reactive gas or gas mixture G, as depicted with the control signal $S(\dot{m})$ is fed to the process at given mass flow $\dot{m}_G$.

In addition to the sputtered material, a vaporization station 5 is provided, namely an electron beam vaporizer or an arc vaporizer, for example an arc or cathode spot vaporizer station, such as for example known from European patent document EP-A 0 277 341, a low-voltage arc vaporizer station, such as for example known in principle from U.S. Pat. No. 4,448,802, or a hollow cathode vaporizer station, such as known from U.S. Pat. No. 3,562,141.

It is also possible to use a boat vaporizer station.

As is evident in FIG. 1, the vaporization rate $R_V$ on the vaporizer station 5 at the vaporizer station 5 is controllable by a control signal $S(R_v)$.

With respect to the electron beam vaporizer used, reference is made to U.S. Pat. No. 5,041,712 (German DE-OS 3,921,040) which, in this respect and with respect to the settability of the vaporization rate, is declared to be an integral component of the present specification and is incorporated here by reference.

The material vaporized at the vaporizer station 5 is preferably at least part of component F of the coating compound, but can also be a material L not involved in the compound $F_xG_y$.

The sputtered material is fed to reaction process 7 at rate $R_z$. Superimposed on this flow is also the vaporized material at rate $R_v$, to process 7.

From the reaction process results, on the one hand, the workpiece is coated with the material compound $F_xG_y$, wherein the degree of reaction on the layer is given by $\gamma = x/y$. If as the material to be vaporized a material L not involved in the layer growth is used, further the compound $L_nG_m$ results from the reaction process 7. As shown in dot-dash lines at 9 in FIG. 1, in the last stated case, deposition of the additional compound together with the compound $F_xG_y$ on the workpiece to be coated, is largely prevented.

In the vacuum receptacle containing the reaction process 7 a signal $S(\gamma)$ is defined which is a unique function of the degree of reaction of the layer to be deposited. For this purpose preferably the partial pressure of the gas or gas mixture G in the reaction volume is determined or, in still more preferred manner, the total pressure in the reaction volume during the coating process is measured. Measurement of the total pressure is possible with measuring cells which are significantly more cost-effective than plasma emission monitors or microbalances or even mass spectrometers which potentially also can be used for defining the signal $S(\gamma)$ according to FIG. 1. The defined signal $S(\gamma)$ is compared with a signal $S_F$ at a difference unit 13, which signal is settable at a setting unit 15 so as to be constant or time-variable. Signal $S(\gamma)$ may be supplied through a control stage 11, to the difference unit 13. The difference signal $\Delta$ present at the output side of the difference unit 13 is supplied to the rate control input of the vaporizer unit 5 as control signal $S(R_v)$. In terms of regulation technology the described process or the described regulation appears approximately as follows, wherein in FIG. 1 additionally the conventional symbols for the variables considered in terms of regulation are shown.

The command variable W is formed at the output side of the setting unit 15 by the signal $S_F$. The output signal of the difference unit 13, $\Delta$, is the control difference. At the output side of the vaporizer unit 5 the sputtering rate $R_z$ is supplied in the sense of a disturbance. Disturbance X is the degree of reaction $\gamma$, the measured signal $S(\gamma)$ is the measured regulating parameter $x_m$.

As is readily apparent, through high amplification of the control path formed by the vaporizer unit 5, i.e. through a high ratio of vaporization rate change per change of the rate control signal $\Delta$ it can be achieved that fluctuations of the degree of reaction effected by fluctuations of the sputtering rate $R_z$ and/or of the gas mass flow are optimally regulated out. Time changes of the behavior of the sputtering unit 1, such as for example through target contamination, essentially do not affect the control loop, since the sputter unit intervenes only in the sense of a disturbance source in the control.

Since it is known that vaporizers with very high vaporization rates can be operated and since, in this sense, between rate control signals and rate a high amplification exists and further, the vaporizer source is far less time-variant, in that it is far less varied due to the process than is the sputter source, the vaporizer unit 5 is extremely well suited to be used according to the invention as final control element in a coating process based on a sputtering process.

If a layer $F_xG_y$ is to be deposited with uniform constant degree of reaction $\gamma$, the sputter unit 1 is driven to sputter through the control signal $S(R_z)$ at constant rate $R_z$. The reactive gas flow $\dot{m}_G$ is also set to be constant with the signal $S(\dot{m})$. The command value for the regulating parameter $X = \gamma$ or for the measured regulating parameter $x_m$ is also kept constant during the layer growth.

If, on the other hand, the layer is to be built up with a given profile of the reaction degree $\gamma$, the sputtering rate $R_z$ and the reactive gas mass flow $m_G$ is varied in given manner as a function of time with the $\gamma$-profile control 17 schematically depicted in FIG. 1, and correspondingly the command variable $W = S_F$ is controlled by the unit 17. Due to the control provided, the reaction degree $\gamma$ is subsequently controlled in a regulating manner.

Figure 2:
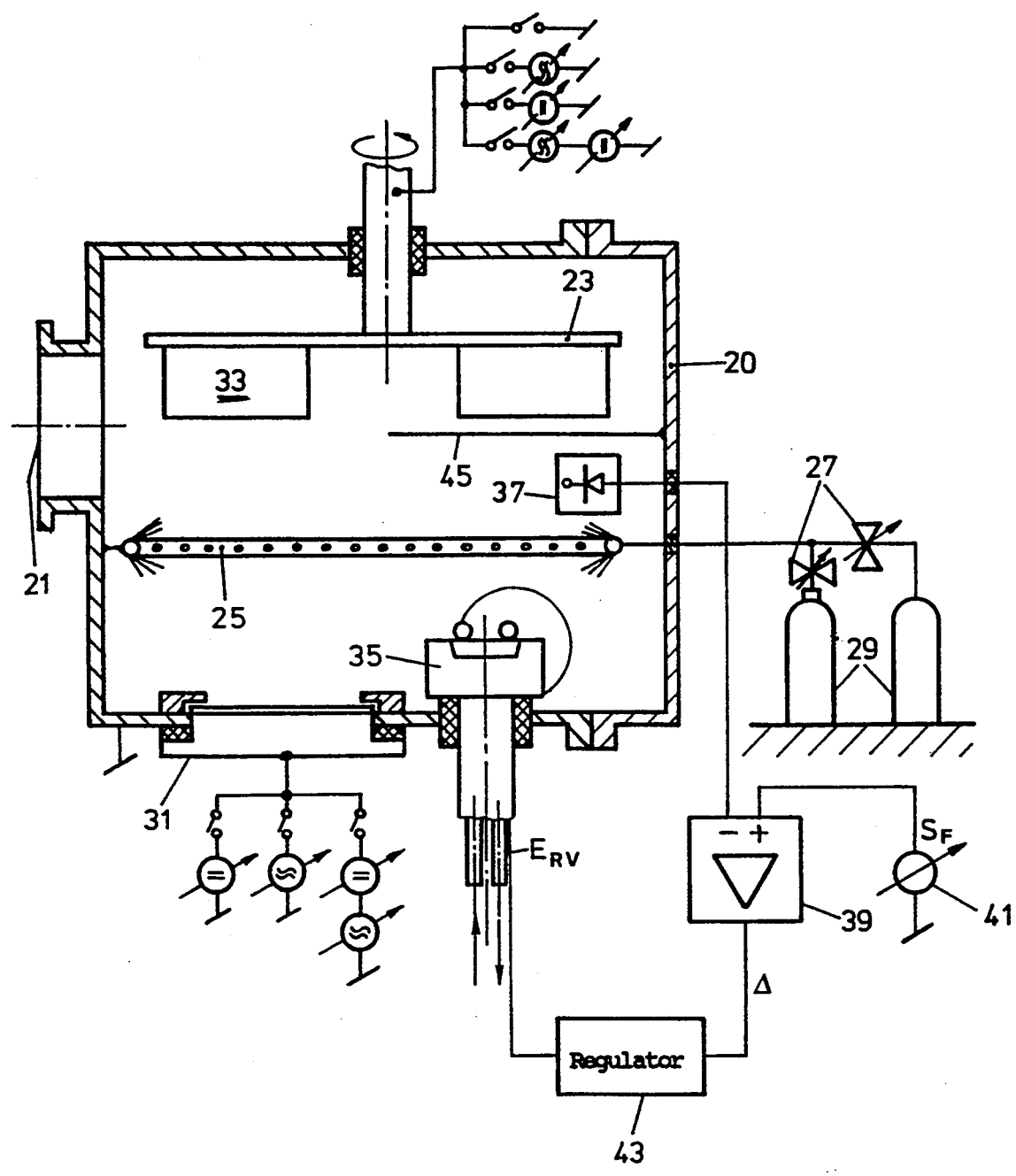
FIG. 2 is a schematic drawing of an embodiment of an apparatus according to the invention.

According to FIG. 2, an installation or apparatus according to the invention comprises a vacuum chamber or receptacle 20 with a pump port 21, a workpiece holder 23 which is preferably supported, as shown, rotatably and electrically insulated on the wall of the receptacle 20. Moreover, in the vacuum receptacle is provided a gas inlet arrangement 25, via controllable valves 27 connected with gas containers 29 for the background gas, for example Ar, for operating the plasma discharge, as well as also for the reactive gas. A cathode sputtering source 31 is further provided, in chamber 20 and is preferably a magnetron source. The magnetron source, as depicted schematically, is fed DC or AC or AC and DC depending on the process to be run. The wall of the receptacle is preferably at ground potential while the workpiece holder 23 with the workpieces 33, again depending on the process to be carried out, is connected to ground or to an AC voltage or DC voltage potential or also to a combined AC and DC current potential.

With the appropriate potential connections of the workpieces 33, the depicted installation becomes an ion plating installation.

In addition to the cathode sputtering source 31, a vaporization source is also provided which, in the example shown in FIG. 2, is an electron beam vaporization source 35. Moreover, a sensor for the measured regulating parameter is provided in chamber 20, in the form of a total pressure sensor 37 whose output is switched to a difference unit 39, to whose second input, analogous to FIG. 1, is set fixedly or, as explained in connection with FIG. 1, is carried from the source 41 the command signal $S_F$ which is variable in time. The regulation difference signal $\Delta$ present at the output side of difference unit 39 is supplied to the rate control input $E_{RV}$ of the electron beam vaporizer 35, potentially via a regulated amplifier 43.

With respect to design and operation of an electron beam vaporizer preferably used here, reference is made to U.S. Pat. No. 5,041,712 (DE-OS 39 21 040) which in this respect is declared to be an integral component of the present specification. While it is entirely possible to change the vaporization rate at the electron beam vaporizer by changing the heating current on the electron emission cathode or by changing the Wehnelt voltage, the rate regulating process described in U.S. Pat. No. 5,041,712 (DE-OS 39 21 040) in which the extent of the electron beam impingement area on the material to be vaporized is controlled, has advantages under the aspect of regulation technique.

As has been stated, instead of the electron beam vaporizer depicted in FIG. 2, a low-voltage arc vaporizer, a hollow cathode vaporizer or a boat vaporizer can be used, or, an arc vaporizer can be used as a preferred electron beam vaporizer.

If in the installation according to FIG. 2 it is to be prevented that the vaporized material after reacting is deposited on the workpieces 33 as layer component, a shield is provided between workpiece holder or workpieces 33 and vaporization source 35 as depicted schematically at 45. In that case, the vaporization source, as already explained in conjunction with FIG. 1, acts only as control member in the stated control loop.

EXAMPLE 1

For the deposition of titanium nitride in an apparatus, designed as shown in principle in FIG. 2 with electron beam vaporizer, the DC power of the titanium sputtering source was kept constant, likewise the mass flow of the reactive gas $N_2$ introduced per unit time was kept constant. The output signal of a total pressure measuring device was used for regulating the electron beam vaporizer power. For this purpose a voltage depending monotonically and constantly on the total pressure was compared at the output side of the total pressure measuring device with a NOMINAL voltage. If the output voltage of the measuring device was higher, indicating a higher pressure than required, the vaporizer power was increased. Titanium was also vaporized. By connecting the workpieces to a potential, the coating was carried out by ion plating. By keeping constant the NOMINAL voltage as the command variable, a constant reaction degree $\gamma$ was achieved over the layer structure.

EXAMPLE 2

By ion plating a coating of titanium tungsten nitride was generated. Instead of the electron beam vaporizer, an arc vaporizer, as described in European document EP-A 0 277 341, was used. By means of the arc vaporizer, tungsten was vaporized while the two magnetron sputtering sources provided were equipped with titanium targets. The sputtering power of the cathode sputtering sources was again kept constant, also the mass flow of the nitrogen introduced was kept constant. By adjusting the arc current on the cathode spot vaporizer, its vaporization rate was controlled in a regulating manner. For generating gradients of the reaction degree $\gamma$ over the growing layer, reactive gas mass flow and the sputtering powers of the two magnetron sources were varied and simultaneously the command signal with which the signal picked up at the total pressure measuring device was compared, was made to track, corresponding to the time-variable reaction degree $\gamma$. To generate gradients of the two metals involved in the layer, further the sputtering power of the sputtering sources could be changed with respect to that of the vaporization source.

While specific embodiments of the invention have been shown and described in detail to illustrate the application of the principles of the invention, it will be understood that the invention may be embodied otherwise without departing from such principles.

What is claimed is:

1. A method of negative feedback for controlling a ratio $\gamma = x:y$ during deposition of a layer of material $F_x G_y$, predominated by cathode-sputtering, wherein a first solid material is cathode-sputtered into a vacuum atmosphere, a gas G is introduced in said atmosphere, said first solid material sputtered is reacted with said gas and a reaction product is deposited, comprising the steps of:

generating a first signal which is indicative of said ratio of the deposited layer material at a moment;
   generating a second signal which is indicative of a desired value for said ratio;
   generating a difference signal of a difference between said first and said second signals;
   evaporating a second solid material into said atmosphere with an adjustable evaporation rate;
   reacting said evaporated second solid material with said gas; and
   adjusting said evaporation rate controlled by said difference signal, so as to minimize said difference signal, thereby negative feedback controlling said ratio of the deposited layer material at a moment to accord with said desired value for said ratio.

2. The method of claim 1, wherein a reaction product of reacting said second solid material with said gas forms a component of said layer material.

3. The method of claim 1, including substantially preventing deposition of a reaction product of said second solid material with said gas, as layer material.

4. The method of claim 1, wherein the rate of said cathode-sputtering and the rate of gas introduction into said vacuum atmosphere are kept substantially constant.

5. The method of claim 1, further comprising the steps of adjusting the rate of said cathode-sputtering and mass flow of said gas introduced into said atmosphere by a third signal which varies with time, and generating said second signal in dependency on said third signal.

6. The method of claim 1, comprising the step of generating said second signal to be dependent on total gas pressure in said atmosphere.

7. The method of claim 1, wherein said evaporating comprises one of electron beam evaporating, arc evaporating thereby cathode-spot evaporating, low voltage arc evaporating or hollow cathode evaporating.

8. The method of claim 11, wherein said cathode-sputtering is magnetron cathode-sputtering.

9. A method of cathode-sputter-deposition of a layer comprising the steps of:
   cathode-sputtering a first solid material into a vacuum atmosphere;
   introducing a gas into said atmosphere;
   reacting said first solid material sputtered with said gas to form a reaction product with a ratio γ of said solid material and said gas;
   generating a first signal indicative of said ratio of the reaction product produced at a moment;
   generating a second signal indicative of a desired value for said ratio of said reaction product;
   generating a difference signal between said first and said second signals;
   evaporating a second solid material into said atmosphere with an adjustable evaporation rate;
   reacting said second solid material with said gas; and
   adjusting said evaporation rate so as to be controlled by said difference signal, and so as to minimize said difference signal, and thereby negative feedback controlling the ratio of the reaction product produced at a moment toward said desired value.

10. A cathode-sputter-deposition apparatus comprising:
    a vacuum chamber;
    at least one cathode-sputter-source in said vacuum chamber;
    a gas inlet arrangement in said vacuum chamber connected to a tank with a reactive gas;
    a negative feedback control-loop comprising:
      a detector in said vacuum chamber for generating a first output signal;
      a setable signal generator for generating a second output signal;
      a difference forming unit, outputs of said detector and of said setable signal generator acting on inputs of said difference forming unit for generating a third output signal; and
      an evaporation source in said vacuum chamber with a rate-adjusted control-input; and
    wherein the output of said difference forming unit acts on said rate-adjusted control-input of said evaporation source.

11. The apparatus of claim 10, wherein said detector is a total pressure sensor.

12. The apparatus of claim 10, wherein said evaporation source is one of an electron beam evaporation source, an arc evaporation source thereby a low voltage arc evaporation source or a cathode-spot evaporation source, and a hollow cathode evaporation source.

13. The apparatus of claim 10, wherein said cathode-sputter-source is a magnetron source.

14. The apparatus of claim 10, further comprising a workpiece holder in said vacuum chamber and a shield between said workpiece-holder and said evaporation source.

15. The apparatus of claim 10, further comprising a workpiece holder connected to the output of an adjustable voltage generator for adjusting an electrical potential, whereon workpieces are set.

* * * * *